(12) United States Patent
Ji et al.

(10) Patent No.: US 12,094,978 B2
(45) Date of Patent: Sep. 17, 2024

(54) OXIDE SEMICONDUCTOR THIN FILM TRANSISTOR AND METHOD OF FORMING THE SAME

(71) Applicant: LG Display Co., Ltd., Seoul (KR)

(72) Inventors: Hyuk Ji, Paju-si (KR); Jin Chae Jeon, Paju-si (KR); Jae Hyun Kim, Gimpo-si (KR); Sun Young Choi, Seoul (KR); Mi Jin Jeong, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 272 days.

(21) Appl. No.: 17/220,676

(22) Filed: Apr. 1, 2021

(65) Prior Publication Data
US 2021/0313470 A1    Oct. 7, 2021

(30) Foreign Application Priority Data

Apr. 2, 2020    (KR) .......................... 10-2020-0040142

(51) Int. Cl.
*H01L 29/786*    (2006.01)
*H01L 29/66*    (2006.01)

(52) U.S. Cl.
CPC .... *H01L 29/7869* (2013.01); *H01L 29/66742* (2013.01); *H01L 29/78618* (2013.01); *H01L 29/78696* (2013.01)

(58) Field of Classification Search
CPC . H01L 29/786–78696; H01L 29/7869–78693; H01L 27/1225;

(Continued)

(56) References Cited

U.S. PATENT DOCUMENTS 5,693,549 A * 12/1997 Kim ................... H01L 29/66757
257/66
6,133,609 A * 10/2000 Nakamura .......... H01L 27/1214
257/365

(Continued)

FOREIGN PATENT DOCUMENTS

KR    10-2015-0051824 A    5/2015
WO    WO 2019/175708 A1    9/2019

OTHER PUBLICATIONS

Seo, JS et al. Solution-Processed Flexible Fluorine-doped Indium Zinc Oxide Thin-Film Transistors Fabricated on Plastic Film at Low Temperature. Sci Rep 3, 2085 (2013); hereinafter Seo (Year: 2013).*

(Continued)

*Primary Examiner* — Eric A. Ward
*Assistant Examiner* — Nora T. Nix
(74) *Attorney, Agent, or Firm* — Birch, Stewart, Kolasch & Birch, LLP

(57) ABSTRACT

An oxide semiconductor thin film transistor and a method of forming the oxide semiconductor thin film transistor are provided. The oxide semiconductor thin film transistor can include a semiconductor layer including a channel region, a source region and a drain region; a first gate insulating layer on the semiconductor layer; a gate electrode on the first gate insulating layer; a second gate insulating layer on the gate electrode; an auxiliary electrode on the second gate insulating layer; an interlayer insulating layer on the auxiliary electrode; and a source electrode and a drain electrode on the interlayer insulating layer, wherein the source region and the drain region being disposed at both sides of the channel region, wherein the gate electrode overlapping with the channel region, and the auxiliary electrode overlapping with the gate electrode.

9 Claims, 5 Drawing Sheets

(58) Field of Classification Search
CPC ......... H01L 21/02565; H01L 29/78666; H01L 29/78675; H01L 29/66757; H01L 29/78648; H01L 29/78633; H01L 2924/13084–13085; H01L 2924/13092; H01L 29/7831–7832; H01L 29/66484; H01L 21/823437–823456; H01L 21/823842; H01L 21/28247; H01L 21/76834; H01L 21/7685–76852; H01L 27/1214–1296; H01L 29/66742–6678; H01L 29/66969; H01L 29/4908; H01L 27/12–13; H01L 2924/13069; H10K 10/46–491

See application file for complete search history.

(56) References Cited

U.S. PATENT DOCUMENTS

| | | | | |
|---|---|---|---|---|
| 2005/0062044 | A1* | 3/2005 | Noda | H01L 29/66757 257/E29.295 |
| 2006/0255377 | A1* | 11/2006 | Tu | H01L 29/8128 257/280 |
| 2007/0145458 | A1* | 6/2007 | Asami | H01L 27/12 257/E27.113 |
| 2015/0206905 | A1* | 7/2015 | Wang | H01L 29/78675 257/66 |
| 2017/0256569 | A1* | 9/2017 | Ohara | H01L 29/4908 |
| 2018/0047822 | A1* | 2/2018 | Lin | H01L 29/2003 |
| 2019/0115407 | A1* | 4/2019 | Cho | H01L 27/1218 |
| 2019/0221429 | A1* | 7/2019 | Tian | H01L 29/78675 |
| 2019/0331972 | A1* | 10/2019 | Nimura | G02F 1/136209 |
| 2021/0005752 | A1* | 1/2021 | Okazaki | H01L 29/78648 |
| 2024/0128347 | A1* | 4/2024 | Cho | H01L 21/31111 |

OTHER PUBLICATIONS

Seo, JS et al. Solution-Processed Flexible Fluorine-doped Indium Zinc Oxide Thin-Film Transistors Fabricated on Plastic Film at Low Temperature. Sci Rep 3, 2085 (2013) (Year: 2013).*

* cited by examiner

OXIDE SEMICONDUCTOR THIN FILM TRANSISTOR AND METHOD OF FORMING THE SAME

CROSS-REFERENCE TO RELATED APPLICATIONS

This application claims the priority benefit of the Korean Patent Application No. 10-2020-0040142 filed on Apr. 2, 2020 in the Republic of Korea, the entire contents of which are hereby expressly incorporated by reference as if fully set forth herein into the present application.

BACKGROUND OF THE INVENTION

Field of the Invention

The present disclosure relates to an oxide semiconductor thin film transistor capable of improving a device characteristic of a thin film transistor, and a method of forming the same.

Discussion of the Related Art

Recently, a flat panel display device, such as a liquid crystal display device and an organic light emitting diode display device, have been developed. Further, research on a display device having a large size and high resolution is actively progressing. Thus, the development of a thin film transistor for securing stable operation and reliability of the display device is needed.

In the display device, the thin film transistor is formed in each pixel, to switch a data voltage applied to the pixel or drive the pixel.

The thin film transistor can be one of an amorphous silicon (a-Si) thin film transistor, a low temperature polycrystalline-silicon (LTPS) thin film transistor, and an oxide semiconductor thin film transistor. The amorphous silicon thin film transistor has an advantage that can be formed in a low-temperature process, but has a disadvantage of very low mobility. The low-temperature polycrystalline silicon thin film transistor has an advantage of high mobility, but has a disadvantage that it requires a high-temperature process and is difficult to make a large area. On the other hand, the oxide semiconductor thin film transistor has mobility higher than the amorphous silicon thin film transistors, and has advantage in increasing the area of the display device by being formed in a low-temperature process.

Hereinafter, an oxide semiconductor thin film transistor according to a related art will be described. FIG. 1 is a cross-sectional view showing an oxide semiconductor thin film transistor according to the related art.

Referring to FIG. 1, the oxide semiconductor thin film transistor includes a substrate 1, a semiconductor layer 10, a gate insulating layer 20, a gate electrode 30, an interlayer insulating layer 40, a source electrode 50 and a drain electrode 60. The semiconductor layer 10 is formed of an oxide semiconductor. The oxide semiconductor thin film transistor can include a passivation layer to prevent the permeation of moisture and oxygen from the outside.

A formation process of the semiconductor layer 10 includes a doping process to improve conductive characteristics. A conductorized source region 10b and a conductorized drain region 10c are formed at both sides of the semiconductor layer 10 in which impurities are added by the doping process, and a channel region 10a is formed in a central portion of the semiconductor layer 10 in which the impurities are not added during the doping process.

Each of the conductorized source region 10b and the conductorized drain region 10c includes a conductorization region DA and a diffusing conductorization region SA. The conductorization region DA is formed by the impurities which are directly added during the doping process. The diffusing conductorization region SA is formed by some of impurities added in the semiconductor layer 10 due to diffuse the impurities during the formation process.

The channel region 10a is defined by self-align method using a gate electrode 30. Using this method, the impurities are blocked by the gate electrode 30 serving as a mask, so that the channel region 10a can be defined without the consideration of an additional mask process and alignment margin.

However, in the formation process of the semiconductor layer 10, a region of the semiconductor layer 10 overlapping with the gate electrode 30 is conductorized by some of doping material diffused into the channel region in a doping process of the entire substrate, or by impurities such as hydrogen diffused into the channel region in a process of forming the passivation layer including silicon nitride (SiNx) containing a large amount of hydrogen. For example, the diffusing conductorization region SA of the semiconductor layer 10 extends not only to a region exposed by the gate electrode 30, but also to a region overlapping with the gate electrode 30, during the formation process.

Thus, in the oxide semiconductor thin film transistor according to the related art, the length of effective channel is reduced by the diffusing conductorization region SA. Since the effective channel formed in the channel region 10a must have a minimum length to maintain the channel characteristics, the gate electrode 30 should be formed to have a width greater than the minimum length of the channel region 10a in consideration of the diffusing conductorization region SA. For example, in order to secure the minimum length of the channel region 10a capable of maintaining the channel characteristics, the width of the gate electrode 30 defining the channel region 10a must be increased. Therefore, in the oxide semiconductor thin film transistor according to the related art, an entire size of the thin film transistor is increased. However, when the size of the thin film transistor is increased as needed in the related art, it is difficult to secure an aperture ratio in a high-resolution display device. Further, since the diffusing conductorization region SA overlaps the gate electrode 30, it can be difficult to realize high-speed driving by the generation of the parasitic capacitance Cgs.

SUMMARY OF THE INVENTION

Accordingly, the present disclosure is directed to a display device that substantially obviates one or more problems due to limitations and disadvantages of the related art.

An object of the present disclosure is to provide an oxide semiconductor thin film transistor capable of minimizing the introduction of hydrogen into the oxide semiconductor and improving the device characteristics.

Generally, the length of an effective channel in the semiconductor layer formed of an oxide semiconductor in the related art can be decreased by diffusing the impurities generated inside the display device during the formation process into the oxide semiconductor, and the performance of the thin oxide semiconductor film transistor can be deteriorated. Therefore, another object of the present disclosure is to provide a thin film transistor in which the length of the effective channel in the semiconductor layer formed of an oxide semiconductor is not reduced.

Further, another object of the present disclosure is to provide a thin film transistor capable of high-speed driving in which the parasitic capacitance generated in the semiconductor layer formed of an oxide semiconductor is reduced by removing an overlapping region between the gate electrode and the diffusing conductorization region.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided an oxide semiconductor thin film transistor. The oxide semiconductor thin film transistor can comprise a semiconductor layer including a channel region, a source region and a drain region, a first gate insulating layer on the semiconductor layer, a gate electrode on the first gate insulating layer, a second gate insulating layer on the gate electrode, an auxiliary electrode on the second gate insulating layer, an interlayer insulating layer on the auxiliary electrode, and a source electrode and a drain electrode on the interlayer insulating layer, wherein the source region and the drain region being disposed at both sides of the channel region, wherein the gate electrode overlapping with the channel region, and wherein the auxiliary electrode overlapping with the gate electrode.

In another embodiment, there is provided a method of forming an oxide semiconductor thin film transistor. The method can include forming an oxide semiconductor layer, depositing a first gate insulating layer on the oxide semiconductor layer, forming a gate electrode on the first gate insulating layer, depositing a second gate insulating layer on the gate electrode, forming a gate contact hole exposing the gate electrode, forming an auxiliary electrode on the second gate insulating layer, doping impurities, depositing an interlayer insulating layer on the auxiliary electrode, forming a source contact hole and a drain contact hole, and forming a source electrode and a drain electrode, wherein the source contact hole and the drain contact hole expose the oxide semiconductor layer, and wherein the source electrode and the drain electrode are electrically connected to the oxide semiconductor layer.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention. In the drawings.

DETAILED DESCRIPTION OF THE EMBODIMENTS

Figure 1:
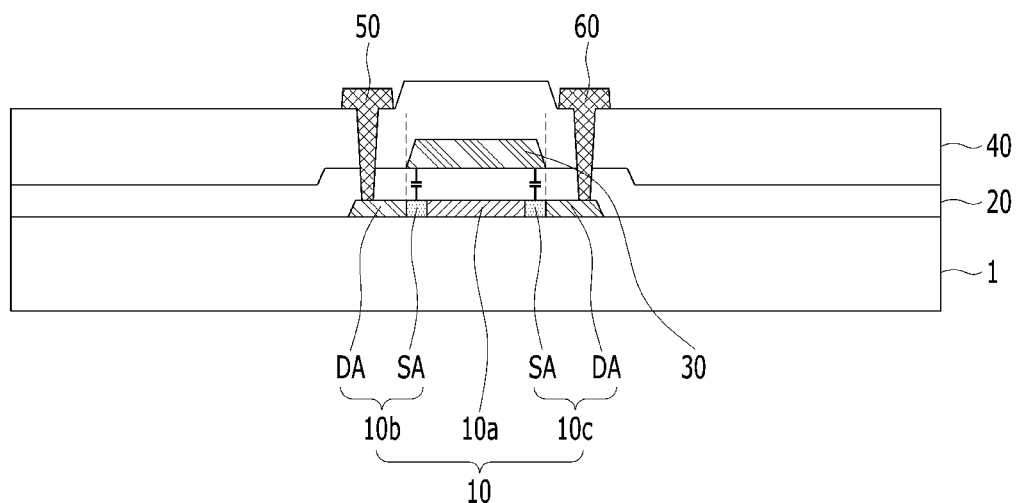
FIG. 1 is a cross-sectional view showing an oxide semiconductor thin film transistor according to a related art.

Reference will now be made in detail to the preferred embodiments of the present disclosure, examples of which are illustrated in the accompanying drawings. Wherever possible, the same reference numbers will be used throughout the drawings to refer to the same or like parts.

The advantages and features of the present disclosure and methods of achieving the same will be more clearly understood from the following detailed description taken in conjunction with the accompanying drawings. However, the present disclosure is not limited to the embodiments described below, and can be implemented in various forms. The embodiments of the present disclosure are provided only to completely disclose the present disclosure and fully inform a person having ordinary knowledge in the field to which the present disclosure pertains of the scope of the present disclosure. Accordingly, the present disclosure is defined only by the scope of the claims.

The shapes, sizes, ratios, angles, numbers and the like shown in the drawings to illustrate the embodiments of the present disclosure are merely exemplary, and the invention is not limited to the illustrated details. Wherever possible, the same reference numbers will be used throughout the drawings to refer to the same or like parts. In the following description, detailed descriptions of related prior art can be omitted so as to avoid unnecessarily obscuring the subject matter of the present disclosure. When terms such as "including", "having" and "comprising" are used throughout the specification, additional components can also be present, unless "only" is used. A component described in a singular form encompasses components in a plural form unless particularly stated otherwise.

It will be interpreted that a constituent component includes an error range, even when there is no additional particular description thereof.

In describing positional relationships, when terms such as "on", "above", "under" and "next to" are used to describe the relationship between two elements, at least one intervening element can be disposed between the two elements unless "immediately" or "directly" is used.

It will be understood that when an element or a layer is referred to as being "on" another element or layer, it can be directly on the other element, or an intervening element can also be present between the two elements.

It will be understood that, although the terms "first", "second", etc. can be used herein to describe various elements, these terms should not be construed as limiting the elements, and are used only to distinguish one element from another. Accordingly, a first element mentioned below can be a second element without exceeding the technical concept of the present disclosure.

Like reference numbers refer to like elements throughout the present disclosure.

In the drawings, the sizes and thicknesses of respective elements are shown for better understanding of the present disclosure and should not be construed as limiting the scope of the present disclosure.

It will be understood that each of the features of the various embodiments of the invention can be partly or entirely united or combined with one another, and it will be sufficiently understood by those skilled in the art that the embodiments can be linked to each other or driven within the technical scope in various ways and can be implemented independently of each other or simultaneously implemented in association with each other.

Hereinafter, the embodiments the present disclosure will be described with reference to the attached drawings.

Figure 2:
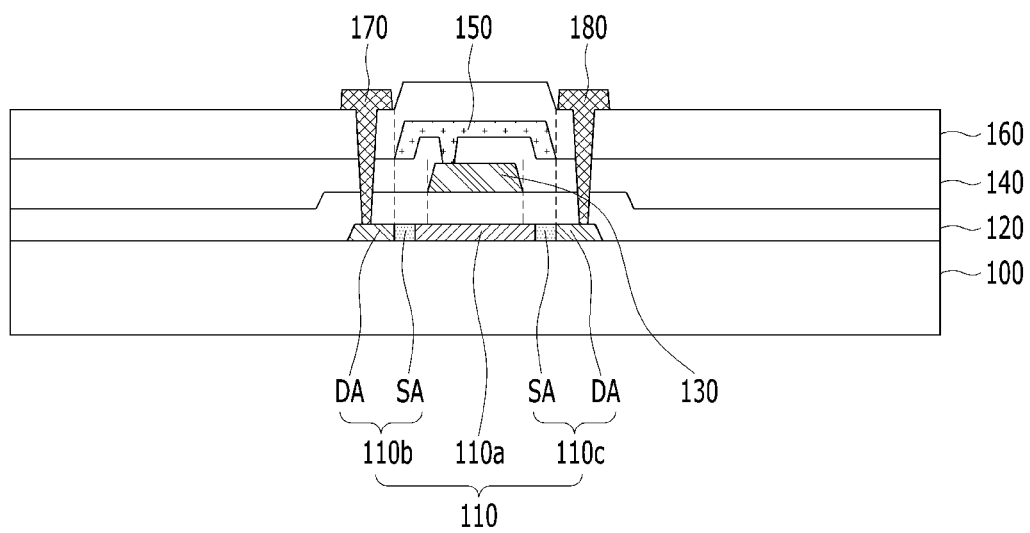
FIG. 2 is a cross-sectional view showing an oxide semiconductor thin film transistor according to an embodiment of the present disclosure.

FIG. 2 is a cross-sectional view showing an oxide semiconductor thin film transistor according to an embodiment of the present disclosure. All the components of the oxide semiconductor thin film transistor and any device (e.g., display devices) including or using the same are operatively coupled and configured.

Referring to FIG. 2, the oxide semiconductor thin film transistor according to the embodiment of the present disclosure can include a substrate 100, a semiconductor layer 110, a first gate insulating layer 120, a gate electrode 130, a second gate insulating layer 140, an auxiliary electrode 150, an interlayer insulating layer 160, a source electrode 170 and a drain electrode 180.

The substrate 100 can support various components of a display device. The substrate 100 can be composed of glass or a plastic material having flexibility. In the case where the substrate 100 is composed of a plastic material, it can be formed of, for example, polyimide (PI). In the case where the substrate 100 is formed of polyimide (PI), the formation process of the display device can be performed in the state in which a support substrate composed of glass is located under the substrate 100, and the support substrate can be released after the formation process of the display device is completed. Further, a back plate for supporting the substrate 100 can be located under the substrate 100 after the support substrate is released.

In the case where the substrate 100 is formed of polyimide (PI), moisture can permeate the semiconductor layer 110 or a light-emitting device by passing through the substrate 100 formed of polyimide (PI), and the performance of the display device can be deteriorated. In the oxide semiconductor thin film transistor according to the embodiment of the present disclosure, the substrate 100 can include double-layered polyimide (PI) in order to prevent the performance of the display device from being deteriorated due to the permeation of the moisture. An inorganic film can be formed between the two polyimides (PI) of the substrate 100. Thus, in the oxide semiconductor thin film transistor according to the embodiment of the present disclosure, the moisture passing through the outer polyimide (PI) of the substrate 100 can be blocked by the inorganic film, and the reliability for the performance of the oxide semiconductor thin film transistor can be improved. The inorganic film can have a single layer structure composed of silicon nitride (SiNx) or silicon oxide (SiOx), or a multi-layer structure thereof.

The semiconductor layer 110 can be disposed on the substrate 100. The semiconductor layer 110 can include a channel region 110a, a source region 110b and a drain region 110c. A channel can be formed in the channel region 110a of the semiconductor layer 110 during driving the oxide semiconductor thin film transistor. The source region 110b and the drain region 110c can be disposed at both sides of the channel region 110a. Each of the source region 110b and the drain region 110c can include a conductorization region DA and a diffusing conductorization region SA.

The semiconductor layer 110 can be composed of an oxide semiconductor. Since the oxide semiconductor is a material having a larger band gap than silicon, electrons cannot exceed the band gap in the off state. Thus, in the oxide semiconductor thin film transistor according to the embodiment of the present disclosure, off-current of the semiconductor layer 110 can be low. Therefore, the oxide semiconductor thin film transistor according to the embodiment of the present disclosure can be suitable for a switching thin film transistor that has a short on-time and a long off-time. However, the present disclosure is not limited thereto. For example, the oxide semiconductor thin film transistor according to the embodiment of the present disclosure can be used as a driving thin film transistor according to the characteristics of the display device. And, the oxide semiconductor thin film transistor according to the embodiment of the present disclosure can be suitable for a high-resolution display device, because the capacitance of auxiliary capacitor can be reduced due to the small off-current.

The semiconductor layer 110 can be composed of IGZO (indium-gallium-zinc-oxide). However, the present disclosure is not limited thereto. For example, the semiconductor layer 110 can be composed of various metal oxides, such as IZO (indium zinc oxide), IGTO (indium-gallium-tin-oxide), and IGO (indium-gallium-oxide), rather than IGZO.

A conductive characteristic of the metal oxide can be improved by a doping process in which impurities are injected.

The channel region 110a, the source region 110b and the drain region 110c of the semiconductor layer 110 can be formed by the doping process to be described later. The channel region 110a of the semiconductor layer 110 may not contain impurities. The source region 110b and the drain region 110c of the layer semiconductor 110 can be conductorized by injection of the impurities. For example, the source region 110b and the drain region 110c of the semiconductor layer 110 can include the impurities.

The source region 110b can mean a region of the semiconductor layer 110 connected to the source electrode 170. The drain region 110c can mean a region of the semiconductor layer 110 connected to the drain electrode 180. The source region 110b and the drain region 110c can be formed by the doping process in which one of group 3 elements, such as boron is injected into the semiconductor layer 110 formed of a metal oxide. The channel region 110a can mean a region of the semiconductor layer 110 that is not conductorized, and remains in state of an oxide semiconductor.

The channel region 110a can be formed by self-align method using the auxiliary electrode 150. Using this method, the auxiliary electrode 150 can serve as a mask blocking the impurities during the doping process, so that the channel region 110a can be defined without considering an additional mask process and alignment margin.

The conductorization region DA of the source region 110b and the drain region 110c can be a region exposed by the auxiliary electrode 150. For example, the conductorization region DA of the source region 110b and the drain region 110c can be a region in which the impurities are directly added during the doping process. The impurities are not direct added into a central portion of the semiconductor layer 110 which is not exposed by the auxiliary electrode 150 during the doping process. A part of the both sides of the central portion can be conductorized by some of doping material diffused into the channel region in a doping process of the entire substrate, or by impurities such as hydrogen diffused into the channel region in a process of forming the passivation layer including silicon nitride (SiNx) containing a large amount of hydrogen. For example, the diffusing conductorization region SA of the source region 110b and the drain region 110c can be disposed a part of the both sides of the central portion of the semiconductor layer 110 which is not exposed by the auxiliary electrode 150.

Since the diffusing conductorization region SA is conductorized by a material diffused in the doping process or the process of forming the passivation layer, the diffusing conductorization region SA can include group 3 elements, such as hydrogen or boron.

The diffusing conductorization region SA can be formed so as overlap both ends of the auxiliary electrode 150. The diffusing conductorization region SA can be formed so as not to overlap by being spaced apart from both ends of the gate electrode 150.

For example, an end of diffusing the conductorization region SA near to the gate electrode can be formed so as being spaced away from an end of the gate electrode 130, and another end of the diffusing conductorization region SA far from the gate electrode can be formed so as being corresponding to an end of the auxiliary electrode 150.

Thus, the diffusing conductorization region SA of the semiconductor layer 110 can be formed so as not to overlap the gate electrode 150. Therefore, in the oxide semiconductor thin film transistor according to the embodiment of the present disclosure, the generation of the parasitic capacitance Cgs between the gate electrode 130 and the semiconductor layer 110 can be prevented, and high-speed driving can be realized.

The first gate insulating layer 120 can be disposed on the semiconductor layer 110.

The first gate insulating layer 120 can have a single layer structure composed of silicon nitride (SiNx) or silicon oxide (Siox), or a multi-layer structure thereof.

A contact hole for connecting the source electrode 170 to the source region 110b of the semiconductor layer 110, and a contact hole for connecting the drain electrode 180 to the drain region 110c of the semiconductor layer 110 can be formed in the first gate insulating layer 120.

The gate electrode 130 can be disposed on the first gate insulating layer 120.

The gate electrode 130 can have a single layer structure composed of at least one of molybdenum (Mo), copper (Cu), titanium (Ti), aluminum (Al), chromium (Cr), gold (Au), nickel (Ni) and neodymium (Nd) or an alloy thereof, or a multi-layer structure thereof.

The gate electrode 130 can be formed so as to overlap the channel region 110a of the semiconductor layer 110. The gate electrode 130 can be formed so as not to overlap the diffusing conductorization region SA of the source region 110b and the drain region 110c.

The second gate insulating layer 140 can be disposed on the first gate insulating layer 120 and the gate electrode 130.

The second gate insulating layer 140 can have a single layer structure composed of silicon nitride (SiNx) or silicon oxide (SiOx), or a multi-layer structure thereof.

A contact hole for connecting the source electrode 170 to the source region 110b of the semiconductor layer 110, a contact hole for connecting the drain electrode 180 to the drain region 110c of the semiconductor layer 110, and a gate contact hole for connecting the auxiliary electrode 150 to the gate electrode 130 can be formed in the second gate insulating layer 140.

The auxiliary electrode 150 can be disposed on the second gate insulating layer 140.

The auxiliary electrode 150 can be formed of a metal capable of collecting hydrogen, such as titanium (Ti).

Thus, the auxiliary electrode 150 can collect hydrogen generated inside the display device. Therefore, the diffusion of the impurities, such as hydrogen which is generated inside the display device during forming the passivation layer including silicon nitride (SiNx) containing a large amount of hydrogen into the semiconductor layer 110 can be prevented. Thereby, in the oxide semiconductor thin film transistor according to the embodiment of the present disclosure, the characteristics of the performance can be improved.

The auxiliary electrode 150 can be formed on the second gate insulating layer 140 so as overlap the gate electrode 130, the channel region 110a of the semiconductor layer 110, and the diffusing conductorization region SA of the source region 110b and the drain region 110c.

A size of the auxiliary electrode 150 can be smaller than that of the semiconductor layer 110. The size of the auxiliary electrode 150 can be larger than that of the gate electrode 130. For example, an end of the auxiliary electrode 150 can be formed between an end of the semiconductor layer 110 and an end of the gate electrode 130, in plan-view.

The auxiliary electrode 150 can be formed so as cover the gate electrode 130. For example, the auxiliary electrode 150 can be formed so as include both ends of the gate electrode 130.

The auxiliary electrode 150 can be connected to the gate electrode 130 through the gate contact hole which is formed in the second gate insulating layer 140.

Thus, in the oxide semiconductor thin film transistor according to the embodiment of the present disclosure, the generation of the parasitic capacitance Cgs can be prevented by removing an overlapping region between the diffusing conductorization region SA of the oxide semiconductor layer 110 and the gate electrode 130.

Further, the oxide semiconductor thin film transistor according to the embodiment of the present disclosure can prevent a length of the effective channel in the semiconductor layer 110 from being decreased. Therefore, in the oxide semiconductor thin film transistor according to the embodiment of the present disclosure, the mobility of the electrons in the semiconductor layer 110 can be improved, and high-speed driving can be realized.

The interlayer insulating layer 160 can be disposed on the second gate insulating layer 140 and the auxiliary electrode 150.

The interlayer insulating layer 160 can have a single layer structure composed of silicon nitride (SiNx) or silicon oxide (SiOx), or a multi-layer structure thereof.

A contact hole for connecting the source electrode 170 to the source region 110b of the semiconductor layer 110, and a contact hole for connecting the drain electrode 180 to the drain region 110c of the semiconductor layer 110 can be formed in the interlayer insulating layer 160.

The source electrode 170 and the drain electrode 180 of the oxide semiconductor thin film transistor can be disposed on the interlayer insulating layer 160.

The source electrode 170 and the drain electrode 180 of the oxide semiconductor thin film transistor can be respectively connected to the semiconductor layer 110 through the contact holes which are formed in the first gate insulating layer 120, the second gate insulating layer 140 and the interlayer insulating layer 160. For example, the source electrode 170 can be connected to the source region 110b of the semiconductor layer 110 through the contact holes which are formed in the first gate insulating layer 120, the second gate insulating layer 140 and the interlayer insulating layer 160, and the drain electrode 180 can be connected to the drain region 110c of the semiconductor layer 110 through the contact holes which are formed in the first gate insulating layer 120, the second gate insulating layer 140 and the interlayer insulating layer 160.

The source electrode 170 and the drain electrode 180 can be formed of the same material. Each of the source electrode 170 and the drain electrode 180 can have a single layer structure composed of at least one of molybdenum (Mo), copper (Cu), titanium (Ti), aluminum (Al), chromium (Cr), gold (Au), nickel (Ni) and neodymium (Nd) or an alloy thereof, or a multi-layer structure thereof. For example, each of the source electrode 170 and the drain electrode 180 can have a triple-layer structure of conductive materials, such as titanium (Ti)/aluminum (Al)/titanium (Ti). However, the present disclosure is not limited thereto.

FIGS. 3A to 3K are cross-sectional views sequentially showing a method of forming the oxide semiconductor thin film transistor according to the embodiment of the present disclosure. Hereinafter, the method of forming the oxide semiconductor thin film transistor according to the embodiment of the present specification will be described with reference to FIGS. 3A to 3K.

Figure 3A:
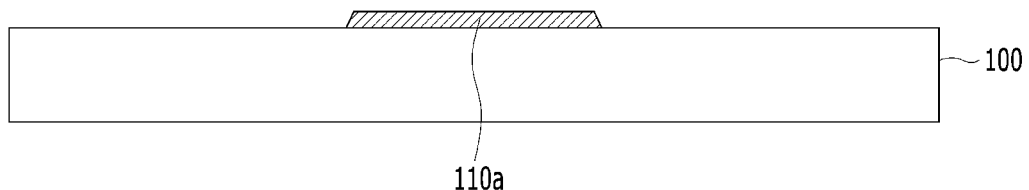
FIGS. 3A to 3K are cross-sectional views sequentially showing a method of forming the oxide semiconductor thin film transistor according to the embodiment of the present disclosure.

Referring to FIG. 3A, the method of forming the oxide semiconductor thin film transistor according to the embodiment of the present specification can include a step of forming a semiconductor layer 110a composed of an oxide semiconductor on a substrate 100. Herein, term 'step' can be composed of one or more sub-steps, or one or more of processes.

The step of forming the semiconductor layer 110a can include a process of depositing the oxide semiconductor on an entire surface of the substrate 100. The oxide semiconductor can include at least one of various metal oxides, such as IGZO (indium-gallium-zinc-oxide), IGO (indium-gallium-oxide), IGTO (indium-gallium-tin-oxide), and IZO (indium zinc oxide). The step of forming the semiconductor layer 110a can include a process of patterning the oxide semiconductor using a first mask.

The method of forming the oxide semiconductor thin film transistor according to the embodiment of the present specification can include a process of forming a light-blocking layer to protect the semiconductor layer 110 from external light on the substrate 100, before forming the semiconductor layer 110a. Further, the method of forming the oxide semiconductor thin film transistor according to the embodiment of the present specification can include a process of forming a buffer layer covering the entire surface of the substrate 100 on the light-blocking layer, before forming the semiconductor layer 110a.

Figure 3B:
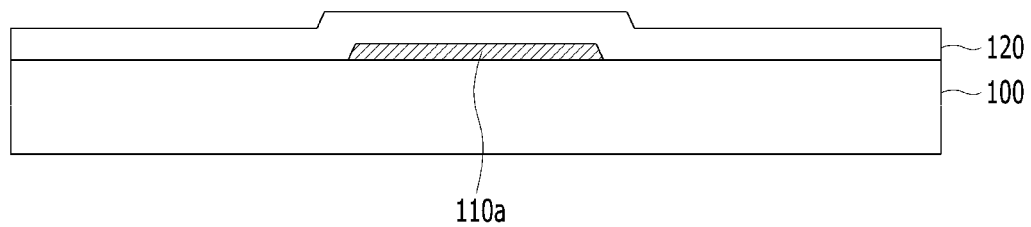

Referring to FIG. 3B, the method of forming the oxide semiconductor thin film transistor according to the embodiment of the present specification can include a step of forming a first gate insulating layer 120 by depositing an insulating material, such as silicon nitride (SiNx) or silicon oxide (SiOx) on the entire surface of the substrate 100 in which the semiconductor layer 110a is formed. The first gate insulating layer 120 can have a single layer structure composed of silicon nitride (SiNx) or silicon oxide (SiOx), or a multi-layer structure thereof.

Figure 3C:
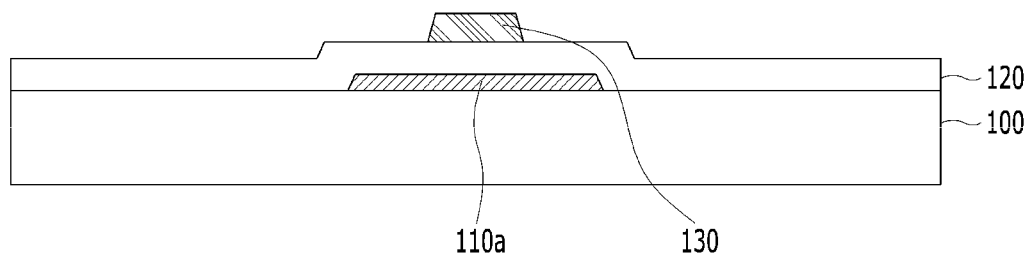

Referring to FIG. 3C, the method of forming the oxide semiconductor thin film transistor according to the embodiment of the present specification can include a step of depositing a metal material on the first gate insulating layer 120, and a step of forming a gate electrode 130 by patterning the metal material using a second mask. The gate electrode 130 can be disposed so as overlap the semiconductor layer 110a.

The gate electrode 130 can have a single layer structure composed of at least one of molybdenum (Mo), copper (Cu), titanium (Ti), aluminum (Al), chromium (Cr), gold (Au), nickel (Ni) and neodymium (Nd) or an alloy thereof, or a multi-layer structure thereof.

Figure 3D:
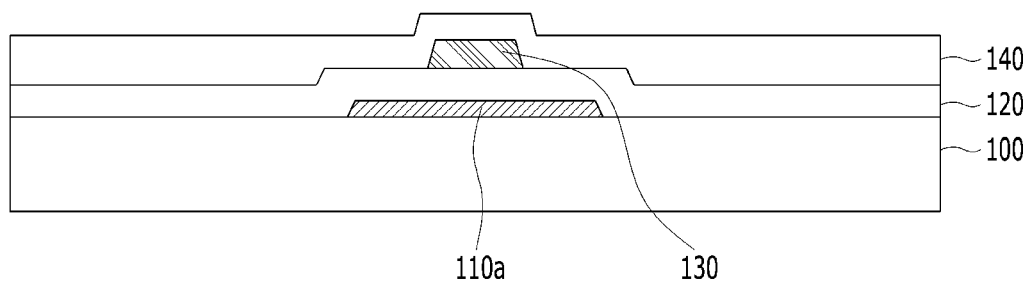

Referring to FIG. 3D, the method of forming the oxide semiconductor thin film transistor according to the embodiment of the present specification can include a step of forming a second gate insulating layer 140 by depositing an insulating material, such as silicon nitride (SiNx) or silicon oxide (SiOx) on the entire surface of the substrate 100 in which the first gate insulating layer 120 and the gate electrode 130 are formed. The second gate insulating layer 140 can have a single layer structure composed of silicon nitride (SiNx) or silicon oxide (Siox), or a multi-layer structure thereof.

Figure 3E:
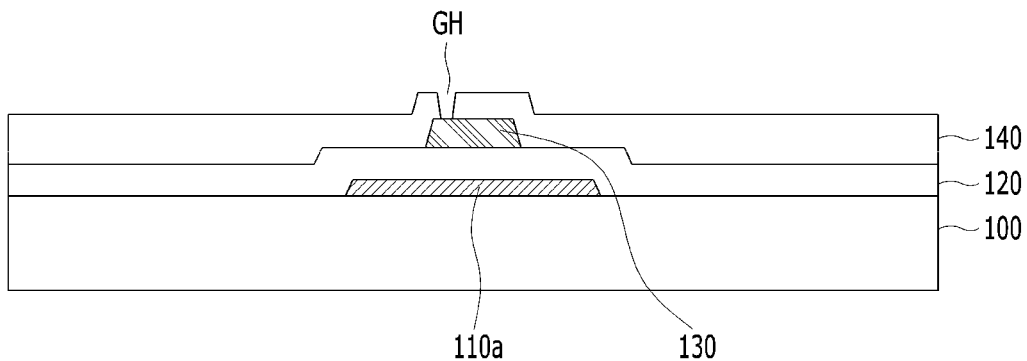

Referring to FIG. 3E, the method of forming the oxide semiconductor thin film transistor according to the embodiment of the present specification can include a step of forming a gate contact hole GH exposing the gate electrode 130 by pattering the second gate insulating layer 140 using a third mask.

Figure 3F:
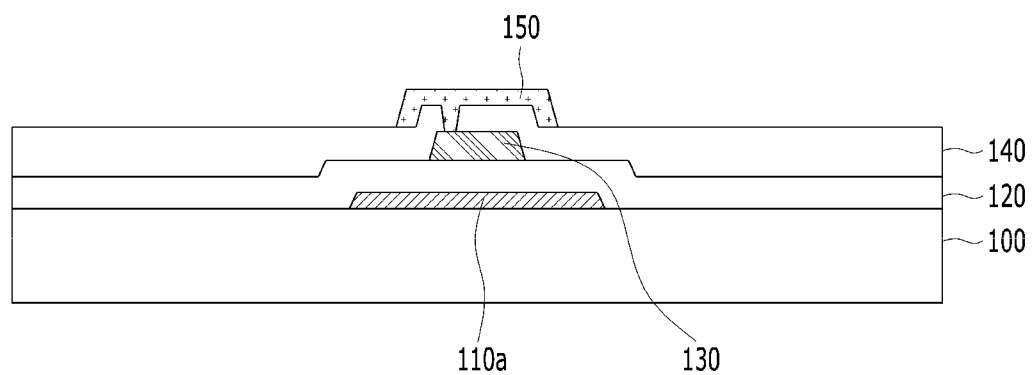

Referring to FIG. 3F, the method of forming the oxide semiconductor thin film transistor according to the embodiment of the present specification can include a step of depositing a metal material on the second gate insulating layer 140 in which the gate contact hole GH is formed, and a step of forming an auxiliary electrode 150 by patterning the metal material using a fourth mask. The auxiliary electrode 150 can be disposed so as overlap the gate electrode 130 and the channel region 110a of the semiconductor layer 110. The auxiliary electrode 150 can be disposed so as overlap a diffusing conductorization region SA of the source region 110b and the drain region 110c, which are formed by a sub-sequent process.

The auxiliary electrode 150 can be formed of a metal capable of collecting hydrogen, such as titanium (Ti).

The auxiliary electrode 150 can be formed so as cover the gate electrode 130. For example, the auxiliary electrode 150 can be formed so as include both ends of the gate electrode 130.

The auxiliary electrode 150 can be connected to the gate electrode 130 through the gate contact hole GH which is formed in the second gate insulating layer 140.

Figure 3G:
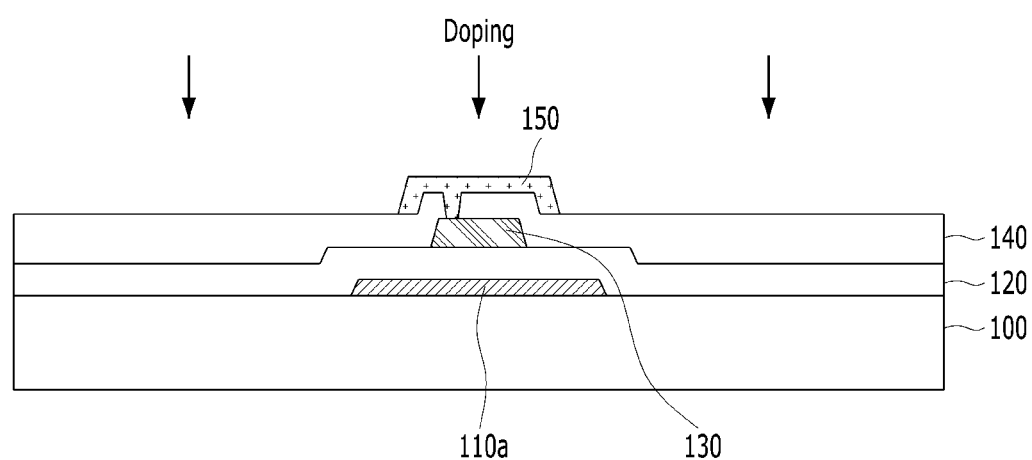

Referring to FIG. 3G, the method of forming the oxide semiconductor thin film transistor according to the embodiment of the present specification can include a step of performing a doping process on the entire surface of the substrate 100.

The doping process includes a process of injecting impurities composed of at least one of group 3 elements, such as boron into the semiconductor layer 110a.

The conditions of the doping process can include the acceleration voltage of 40 to 100 keV and the current density of $1E15/cm^3$. For example, in the method of forming the oxide semiconductor thin film transistor according to the embodiment of the present specification, the doping process can include a process of injecting impurities with the acceleration voltage of 40 to 100 kev and the current density of $1E15/cm^3$ into the substrate 100 in which the second gate insulating layer 140 is formed.

Figure 3H:
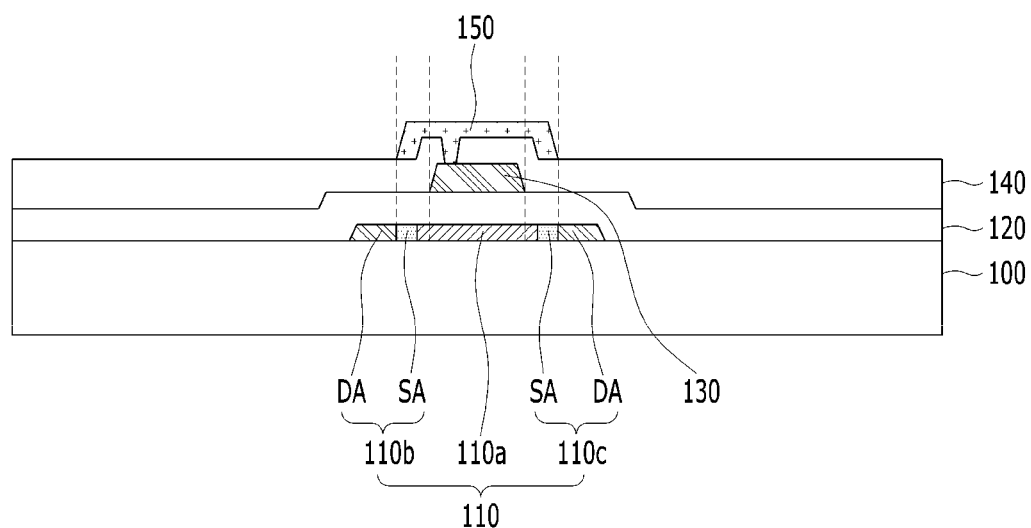

Referring to FIG. 3H, in the method of forming the oxide semiconductor thin film transistor according to the embodiment of the present specification, the semiconductor layer 110 can be formed by the doping process as shown in FIG. 3G. The semiconductor layer 110 can include a channel region 110a, the source region 110b and the drain region 110c. The source region 110b and the drain region 110c can include a region exposed by the auxiliary electrode 150. For example, the source region 110b and the drain region 110c can include a region being conductorized by adding the impurities. The channel region 110a can be not conductorized. For example, the channel region 110a can be a region in which the impurities are not added by blocking due to the auxiliary electrode 150.

The source region 110b and the drain region 110c of the semiconductor layer 110 which are conductorized can have low-resistance. Thus, the device performance of the oxide semiconductor thin film transistor according to the embodiment of the present disclosure can be improved.

The source region 110b and the drain region 110c can be formed by the doping process of injecting at least one of group 3 elements, such as boron into the semiconductor layer 110 formed of a metal oxide.

Each of the source region 110b and the drain region 110c can include a conductorization region DA. The conductorization region DA of the source region 110b and the drain region 110c can be a region which is exposed by the auxiliary electrode 150, so that the impurities are directly added during the doping process. Although the impurities are not directly added in a part of both sides of a central portion which is not exposed by the auxiliary electrode 150 during the doping process, the part of the both sides of the central portion can be conductorized by diffusion of some impurities into the channel region 110a in a process of doping the entire substrate, or by diffusion of impurities such as hydrogen into the channel region 110a in a process of forming a passivation layer including silicon nitride (SiNx) containing a large amount of hydrogen. The part of the both sides of the central portion conductorized by diffusion can be defined as a diffusing conductorization region SA. For example, each of the source region 110b and the drain region 110c can include the diffusing conductorization region SA disposed closer the region channel 110a than the conductorization region DA.

Since the diffusing conductorization region SA is conductorized by a material diffused in the doping process or the process of forming the passivation layer, the diffusing conductorization region SA can include group 3 elements, such as hydrogen or boron.

The diffusing conductorization region SA can be formed so as overlap both ends of the auxiliary electrode 150. The diffusing conductorization region SA can be formed so as not to overlap by being spaced apart from both ends of the gate electrode 130.

For example, an end of the diffusing conductorization region SA near top the gate electrode can be formed so as being spaced away from an end of the gate electrode 130, and another end of the diffusing conductorization region SA far from the gate electrode can be formed so as being corresponding to an end of the auxiliary electrode 150.

Thus, the diffusing conductorization region SA of the semiconductor layer 110 can be formed so as not to overlap the gate electrode 150. Therefore, in the method of the oxide semiconductor thin film transistor according to the embodiment of the present disclosure, the generation of the parasitic capacitance Cgs between the gate electrode 130 and the semiconductor layer 110 can be prevented, and high-speed driving can be realized.

Thereby, in the method of the oxide semiconductor thin film transistor according to the embodiment of the present disclosure, the generation of the parasitic capacitance Cgs can be prevented by removing an overlap region between the diffusing conductorization region SA of the semiconductor layer 110 and the gate electrode 130.

Further, in the method of the oxide semiconductor thin film transistor according to the embodiment of the present disclosure, reducing the length of the effective channel in the semiconductor layer 110 can be prevented, the mobility of the electrons in the semiconductor layer 110 can be improved, and high-speed driving can be realized.

Figure 3I:
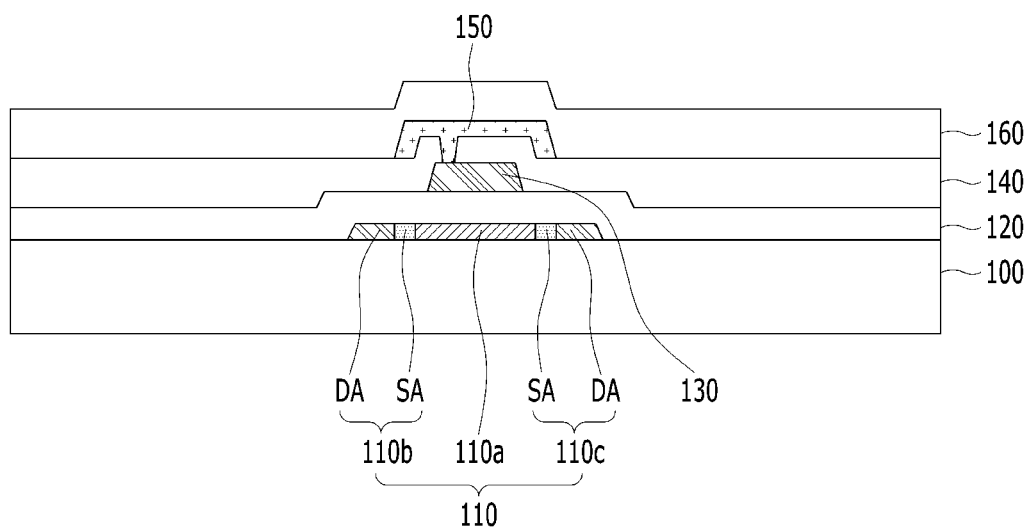

Referring to FIG. 3I, the method of forming the oxide semiconductor thin film transistor according to the embodiment of the present specification can include a step of forming an interlayer insulating layer 160 on the entire surface of the substrate 100 in which the second gate insulating layer 140 and the auxiliary electrode 150 by depositing an insulating material, such as silicon nitride (SiNx) or silicon oxide (SiOx). The interlayer insulating layer 160 can have a single layer structure composed of silicon nitride (SiNx) or silicon oxide (SiOx), or a multi-layer structure thereof.

Figure 3J:
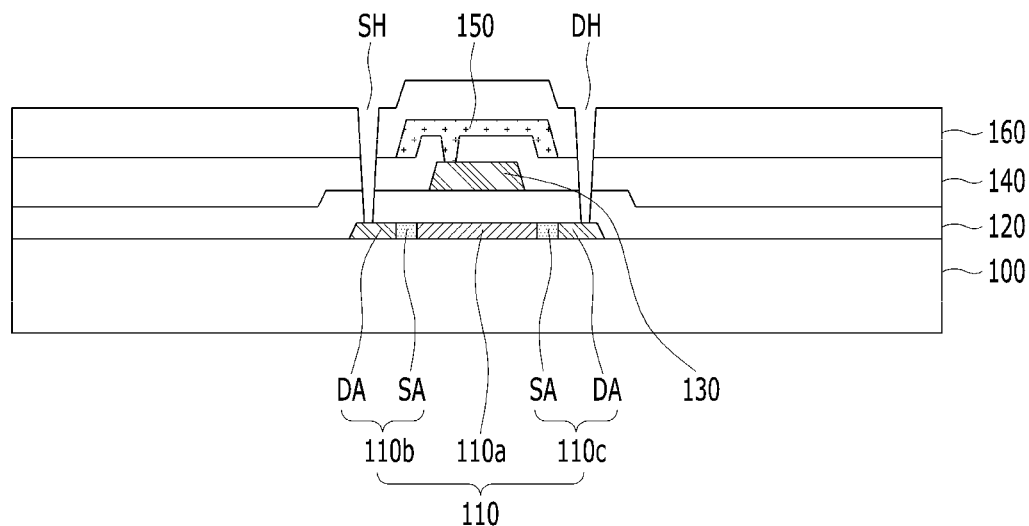

Referring to FIG. 3J, the method of forming the oxide semiconductor thin film transistor according to the embodiment of the present specification can include a step of forming a source contact hole SH exposing the source region 110b of the semiconductor layer 110 and a drain contact hole DH exposing the drain region 110c of the semiconductor layer 110 by patterning the first gate insulating layer 120, the second gate insulating layer 140 and the interlayer insulating layer 160 using a fifth mask.

Figure 3K:
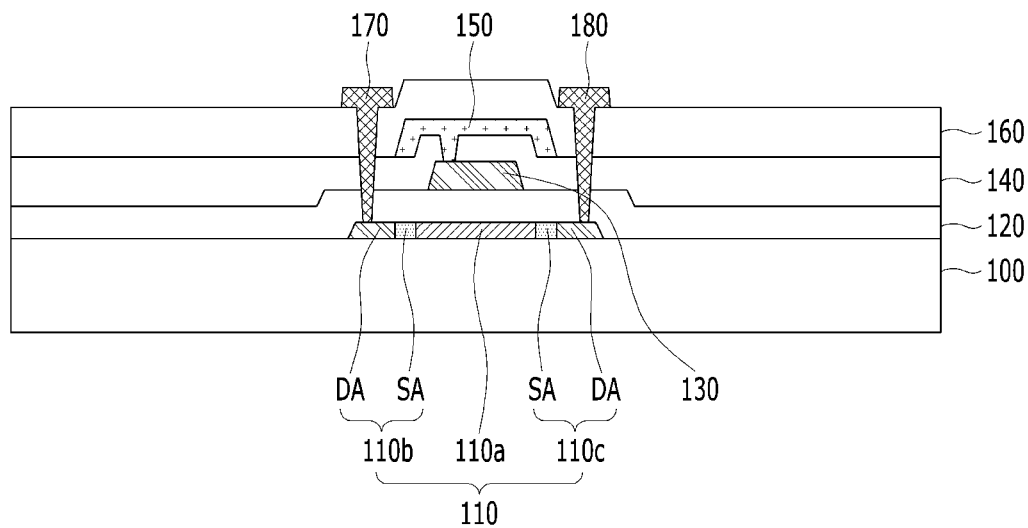

Referring to FIG. 3K, the method of forming the oxide semiconductor thin film transistor according to the embodiment of the present specification can include a step of depositing a source-drain metal on the interlayer insulating layer 160 in which the source contact hole SH and the drain contact hole DH are formed, and a step of forming the source electrode 170 and the drain electrode 180 by patterning the source-drain metal using a sixth mask.

The source electrode 170 and the drain electrode 180 can have a single layer structure composed of at least one of molybdenum (Mo), copper (Cu), titanium (Ti), aluminum (Al), chromium (Cr), gold (Au), nickel (Ni) and neodymium (Nd) or an alloy thereof, or a multi-layer structure thereof. For example, the source electrode 170 and the drain electrode 180 can have a triple-layer structure of conductive materials, as such titanium (Ti)/aluminum (Al)/titanium (Ti). However, the present disclosure is not limited thereto and other variations are possible.

The source electrode 170 can be connected to the conductorization region DA of the source region 110b which is a side of the semiconductor layer 110 through the source contact hole SH. The drain electrode 180 can be connected to the conductorization layer DA of the drain region 110c which is another side of the semiconductor layer 110 through the drain contact hole DH.

The display device according to the embodiment of the present disclosure can include a liquid crystal display device (LCD), a field emission display device (FED), an organic light emitting display device (OLED) and a quantum dot display device.

The display device according to the embodiment of the present disclosure can include a set electronic device apparatus, a set device or a set apparatus. The set electronic device, the set device and the set apparatus can include a complete product or a final product including LCM or OLED module, such as a laptop computer, a TV and a computer monitor. The set electronic device, the set device and the set apparatus can include an automotive display apparatus or an equipment display apparatus including another type of vehicle. The set electronic device, the set device and the set apparatus can include a mobile electronic device apparatus of smart phone or electric pad, any wearable electronic device, a user-interface device, etc.

The oxide semiconductor thin film transistor according to the embodiment of the present disclosure can be described as below.

The oxide semiconductor thin film transistor according to the embodiment of the present disclosure can comprise a semiconductor layer including a channel region, a source region and a drain region, a first gate insulating layer on the semiconductor layer, a gate electrode on the first gate insulating layer, a second gate insulating layer on the gate electrode, an auxiliary electrode on the second gate insulating layer, an interlayer insulating layer on the auxiliary electrode, and a source electrode and a drain electrode on the interlayer insulating layer, wherein the source region and the drain region being disposed at both sides of the channel region, wherein the gate electrode overlapping with the channel region, and wherein the auxiliary electrode overlapping with the gate electrode.

In the oxide semiconductor thin film transistor according to the embodiment of the present disclosure, each of the source region and the drain region can include a conductorization region and a diffusing conductorization region.

In the oxide semiconductor thin film transistor according to the embodiment of the present disclosure, the diffusing conductorization region can overlap a portion of the auxiliary electrode.

In the oxide semiconductor thin film transistor according to the embodiment of the present disclosure, the diffusing conductorization region may not overlap with the gate electrode.

In the oxide semiconductor thin film transistor according to the embodiment of the present disclosure, the auxiliary electrode can include titanium.

In the oxide semiconductor thin film transistor according to the embodiment of the present disclosure, a side of the diffusing conductorization region can be spaced away from an end of the gate electrode, and another side of the diffusing conductorization region can be corresponding to an end of the auxiliary electrode.

In the oxide semiconductor thin film transistor according to the embodiment of the present disclosure, the auxiliary electrode can overlap the gate electrode, the channel region and the diffusing conductorization region.

In the oxide semiconductor thin film transistor according to the embodiment of the present disclosure, a width of the channel region can be formed larger than a width of the gate electrode.

In the oxide semiconductor thin film transistor according to the embodiment of the present disclosure, the conductorization region can include at least one of group 3 elements.

In the oxide semiconductor thin film transistor according to the embodiment of the present disclosure, the diffusing conductorization region can include hydrogen and/or at least one of group 3 elements. The group 3 elements here can include fluorine.

In the oxide semiconductor thin film transistor according to the embodiment of the present disclosure, the group 3 elements can include fluorine.

A method of forming an oxide semiconductor thin film transistor can include forming an oxide semiconductor layer, depositing a first gate insulating layer on the oxide semiconductor layer, forming a gate electrode on the first gate insulating layer, depositing a second gate insulating layer on the gate electrode, forming a gate contact hole exposing the gate electrode, a step of forming an auxiliary electrode on the second gate insulating layer, doping impurities, depositing an interlayer insulating layer on the auxiliary electrode, forming contact hole and a drain contact hole, and forming a source electrode and a drain electrode, wherein the source contact hole and the drain contact hole expose the oxide semiconductor layer, and wherein the source electrode and the drain electrode are electrically connected to the oxide semiconductor layer.

In the method of forming the oxide semiconductor thin film transistor, each of the source region and the drain region can include a conductorization region and a diffusing conductorization region.

In the method of forming the oxide semiconductor thin film transistor, the diffusing conductorization region can overlap a portion of the auxiliary electrode.

In the method of forming the oxide semiconductor thin film transistor, the diffusing conductorization region may not overlap with the gate electrode.

In the method of forming the oxide semiconductor thin film transistor, the auxiliary electrode can be electrically connected to the gate electrode through a gate contact hole.

In the method of forming the oxide semiconductor thin film transistor, the auxiliary electrode can include titanium.

In the method of forming the oxide semiconductor thin film transistor, a width of the channel region can be formed larger than a width of gate electrode.

In the method of forming the oxide semiconductor thin film transistor, a step of doping can be performed by acceleration voltage of 40 to 100 keV.

Although the exemplary embodiments of the present disclosure have been described in detail with reference to the accompanying drawings, the disclosure is not limited thereto and can be embodied in many different forms without departing from the technical concept of the present disclosure. Therefore, the exemplary embodiments of the present disclosure are provided for illustrative purposes only but not intended to limit the technical spirit of the present disclosure. The scope of the technical concept of the present disclosure is not limited thereto. Therefore, it should be understood that the above-described exemplary embodiments are illustrative in all aspects and do not limit the present disclosure. The protection scope of the present disclosure should be construed based on the appended claims, and all the technical concepts in the equivalent scope thereof should be construed as falling within the scope of the present disclosure.

In the result, the oxide semiconductor thin film transistor according to the embodiments of the present disclosure can include an auxiliary electrode on a gate electrode. Thus, in the oxide semiconductor thin film transistor according to the embodiments of the present disclosure, the reliability can be improved.

For example, the oxide semiconductor thin film transistor according to the embodiments of the present disclosure can prevent the impurities generated inside the display device during the formation process from diffusing into the channel region of the semiconductor layer formed of an oxide semiconductor.

In addition, in the oxide semiconductor thin film transistor according to the embodiments of the present disclosure, the auxiliary electrode can be formed of a metal capable of collecting hydrogen, so that the introduction of hydrogen into the oxide semiconductor layer can be minimized. Thus, in the oxide semiconductor thin film transistor according to the embodiments of the present disclosure, the device characteristics can be improved.

Further, in the oxide semiconductor thin film transistor according to the embodiments of the present disclosure, the generation of the parasitic capacitance can be prevented by removing an overlapping region between the diffusing conductorization region of the oxide semiconductor layer and the gate electrode.

Furthermore, the oxide semiconductor thin film transistor according to the embodiments of the present disclosure can prevent reducing a length of the effective channel in the oxide semiconductor layer. Thus, in the oxide semiconductor thin film transistor according to the embodiments of the present disclosure, the mobility of the electrons in the oxide semiconductor layer can be improved, and high-speed driving can be realized.

What is claimed is:

1. An oxide semiconductor thin film transistor comprising:
   a semiconductor layer including a channel region, a source region and a drain region, the source region and the drain region being disposed at opposite sides of the channel region, respectively;
   a first gate insulating layer on the semiconductor layer;
   a gate electrode on the first gate insulating layer, the gate electrode overlapping with the channel region;
   a second gate insulating layer on the gate electrode;
   an auxiliary electrode on the second gate insulating layer, the auxiliary electrode overlapping with the gate electrode;
   an interlayer insulating layer on the auxiliary electrode; and
   a source electrode and a drain electrode on the interlayer insulating layer,
   wherein the source region includes a first diffusing conductorization region located on one side of the channel region and a first conductorization region located on one side of the first diffusing conductorization region, and the drain region includes a second diffusing conductorization region located on another side of the channel region and a second conductorization region located on another side of the second diffusing conductorization region,
   wherein the first and second diffusing conductorization regions overlap with the auxiliary electrode and do not overlap with the gate electrode,
   wherein the first and second conductorization regions do not overlap with the auxiliary electrode,
   wherein each end of the first and second diffusing conductorization regions near to the gate electrode is spaced away from an end of the gate electrode, and each another end of the first and second diffusing conductorization regions distal from the gate electrode corresponds to an end of the auxiliary electrode,
   wherein the auxiliary electrode includes a contact portion and is connected to the gate electrode through the contact portion, and the contact portion is disposed through a gate contact hole included in the second gate insulating layer, and
   wherein the contact portion is disposed off-center with respect to a central portion of the gate electrode.

2. The oxide semiconductor thin film transistor according to claim 1, wherein the auxiliary electrode includes titanium.

3. The oxide semiconductor thin film transistor according to claim 1, wherein the auxiliary electrode overlaps the gate electrode, the channel region and the first and second diffusing conductorization regions.

4. The oxide semiconductor thin film transistor according to claim 1, wherein a width of the channel region is larger than a width of the gate electrode.

5. The oxide semiconductor thin film transistor according to claim 1, wherein the first and second conductorization regions include at least one of group 3 elements.

6. The oxide semiconductor thin film transistor according to claim 1, wherein the first and second diffusing conductorization regions include hydrogen and at least one of group 3 elements.

7. The oxide semiconductor thin film transistor according to claim 5, wherein the group 3 elements include fluorine.

8. The oxide semiconductor thin film transistor according to claim 1, wherein each end of the first and second diffusing conductorization regions near to the gate electrode is directly exposed to the channel region.

9. The oxide semiconductor thin film transistor according to claim 1, wherein the gate electrode is directly disposed on the first gate insulating layer.

* * * * *